US012578401B2

(12) United States Patent
    Motz

(10) Patent No.: US 12,578,401 B2
(45) Date of Patent: Mar. 17, 2026

(54) APPARATUS AND METHOD FOR COMPENSATING FOR SENSITIVITY FLUCTUATIONS OF A MAGNETIC FIELD SENSOR CIRCUIT

(71) Applicant: Infineon Technologies AG, Neubiberg (DE)

(72) Inventor: Edwin Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 150 days.

(21) Appl. No.: 18/456,750

(22) Filed: Aug. 28, 2023

(65) Prior Publication Data

US 2024/0069122 A1     Feb. 29, 2024

(30) Foreign Application Priority Data

Aug. 30, 2022    (DE) .......................... 102022121887.2

(51) Int. Cl.
    *G01R 33/00*     (2006.01)
    *G01R 33/07*     (2006.01)
    *G01R 33/09*     (2006.01)
(52) U.S. Cl.
    CPC ......... *G01R 33/0029* (2013.01); *G01R 33/07* (2013.01); *G01R 33/098* (2013.01)
(58) Field of Classification Search
    CPC .. G01R 33/0029; G01R 33/07; G01R 33/098; G01R 33/0035
    See application file for complete search history.

(56) References Cited

U.S. PATENT DOCUMENTS

| | | | | |
|---|---|---|---|---|
| 6,268,725 | B1 * | 7/2001 | Vernon | G01R 33/04 |
| | | | | 324/253 |
| 9,219,522 | B2 * | 12/2015 | Mesecher | H04J 13/0003 |
| 11,307,267 | B1 * | 4/2022 | Polley | G01R 33/0035 |
| 2012/0133356 | A1 * | 5/2012 | Charlier | G01R 33/07 |
| | | | | 324/202 |
| 2016/0169983 | A1 | 6/2016 | Chang et al. | |
| 2017/0336481 | A1 * | 11/2017 | Latham | G01R 35/005 |
| 2018/0080800 | A1 * | 3/2018 | Chen | G01D 5/142 |
| 2019/0226880 | A1 | 7/2019 | Raman et al. | |
| 2020/0011902 | A1 * | 1/2020 | Shimizu | G01R 19/0092 |
| 2020/0072875 | A1 * | 3/2020 | Morita | G01R 15/185 |

FOREIGN PATENT DOCUMENTS

| | | | |
|---|---|---|---|
| DE | 102015011617 A1 | 3/2016 |
| DE | 102015109009 A1 | 12/2016 |
| DE | 102016120182 A1 | 5/2017 |
| DE | 102020110682 A1 | 10/2021 |
| EP | 2402777 A | 1/2012 |

* cited by examiner

*Primary Examiner* — Alvaro E Fortich
(74) *Attorney, Agent, or Firm* — Harrity & Harrity, LLP

(57)     ABSTRACT
A magnetic sensor apparatus includes a magnetic field generating circuit which is configured to generate a magnetic field, a magnetic field sensor circuit which is configured to output a sensor signal in response to the magnetic field, which sensor signal has a signal amplitude dependent on a sensitivity of the magnetic field sensor circuit, an amplifier circuit which is configured to amplify the sensor signal and to output an amplified sensor signal with an amplified signal amplitude, and a control circuit which is configured to use a setting signal to set a supply signal of the magnetic field sensor circuit and/or a gain of the amplifier circuit such that the amplified signal amplitude corresponds to a target amplitude.

23 Claims, 12 Drawing Sheets

FIG. 1

Metal resistor or silicided resistor or a combination
of resistors with different stress dependence

APPARATUS AND METHOD FOR COMPENSATING FOR SENSITIVITY FLUCTUATIONS OF A MAGNETIC FIELD SENSOR CIRCUIT

CROSS REFERENCE TO RELATED APPLICATION

This application claims priority to German Patent Application No. 102022121887.2 filed on Aug. 30, 2022, the content of which is incorporated by reference herein in its entirety.

TECHNICAL FIELD

The present disclosure relates to magnetic sensors in general and in particular to compensation for sensitivity drift of magnetoresistive sensors.

BACKGROUND

Magnetoresistive effects are all effects that describe the change in an electrical resistance of a material by applying an external magnetic field. These include, in particular, the anisotropic magnetoresistive effect (AMR effect), the giant magnetoresistance (GMR effect), the colossal magnetoresistive effect (CMR effect), the magnetic tunnel resistance (TMR effect) and the planar Hall effect. The various magnetoresistive resistances are commonly also referred to as xMR resistances below.

Magnetoresistive sensors (e.g., xMR) sensors are usually realized in the form of half-bridge or full-bridge circuits, whereby the latter can provide a differential sensor signal. Linear xMR sensor bridges may suffer from sensitivity drift caused by mechanical stress (lifetime stability problem), temperature changes, and/or incomplete temperature compensation. Technological variation is also sometimes high and should be trimmed. It is known to trim the sensor sensitivity over the temperature, but this does not solve the drift problem.

Previous stress compensation methods are based on a known correlation of a stress sensor to the sensitivity of a magnetic field sensor on the chip. This correlation is used to compensate for the drift (due to mechanical stress changes). But now there are a wide variety of stress components:

Stress from the sum in the X and Y directions of a chip geometry,
Differential stress,
Shear stress,
Z stress perpendicular to the chip plane,
Inhomogeneous stress.

Not all components can be taken into account, which would be too expensive, and in addition correlation factors are also influenced by technological and manufacturing-related fluctuations. In addition, temperature coefficients and correlations must be determined very precisely in laboratory experiments using a sample, since no stress fluctuations (e.g., due to changes in moisture in the plastic package of the IC, or soldering the IC onto a printed circuit board) can be measured individually for each IC during production. Therefore, there is reliance on statistical mean values of the correlation coefficients and their temperature profile, without being able to take into account their manufacturing-related tolerances.

Therefore, there is a need for magnetic sensor apparatuses that can compensate for the sensitivity drift.

SUMMARY

This need is taken into account using apparatuses and methods according to the independent patent claims. The dependent claims relate to advantageous developments.

A first aspect of the present disclosure proposes a magnetic sensor apparatus. The magnetic sensor apparatus includes a magnetic field generating circuit which is configured to generate a magnetic field. The magnetic field can be predefined (e.g., known). The magnetic sensor apparatus includes a magnetic field sensor circuit which is configured to output a sensor signal in response to the magnetic field, which sensor signal has a signal amplitude dependent on a sensitivity (measurement sensitivity) of the magnetic field sensor circuit. The magnetic sensor apparatus includes an amplifier circuit which is configured to amplify the sensor signal and to output an amplified sensor signal with an amplified signal amplitude. In addition, the magnetic sensor apparatus includes a control circuit which is configured to use a setting signal to set a supply signal (supply current, supply voltage) of the magnetic field sensor circuit and/or a gain of the amplifier circuit such that the amplified signal amplitude corresponds to or approaches a target amplitude. A sensitivity drift of the magnetic field sensor circuit can be compensated for by adjusting the supply signal and/or gain to the target amplitude.

According to some example implementations, the magnetic field sensor circuit includes at least one Hall sensor.

Alternatively, the magnetic field sensor circuit may include at least one xMR sensor. The xMR sensor may be in the form of an xMR sensor bridge circuit and in particular a TMR sensor bridge circuit.

According to some example implementations, the magnetic field generating circuit includes a current conductor for an electrical excitation current. For example, the current conductor and the magnetic field sensor circuit can be arranged on a common semiconductor chip. The current conductor is also referred to as a so-called Wire on Chip (WoC), in order to generate the magnetic field using the electrical excitation current. The amplifier circuit and the control circuit can also be integrated on the chip.

According to some example implementations, the magnetic field generating circuit is configured to generate the magnetic field using an AC excitation current (AC=alternating current) as an AC magnetic field. Such an AC magnetic field for trimming the magnetic field sensor circuit can be superimposed, for example, on a DC magnetic field (DC=direct current) to be measured.

According to some example implementations, the magnetic field generating circuit is configured to generate the (AC) magnetic field according to a spreading code. For example, the electrical excitation current for the magnetic field may be modulated according to the spreading code. This is similar to a band spreading method such as CDMA (Code Division Multiple Access) or DSSS (Direct Sequence Spread Spectrum), where a message to be transmitted is spread with the spreading code which consists of a sequence of chips or pulses.

According to some example implementations, the magnetic field generating circuit is configured to generate the predefined magnetic field according to a pseudo-random pilot signal (e.g., pseudo-random pilot signal=spreading code). For example, the electrical excitation current can be modulated according to the pseudo-random pilot signal. The pseudo-random pilot signal can be a digital n-bit signal, with $n \geq 1$. For example, it may be a binary pseudo-random pilot signal.

According to some example implementations, the magnetic sensor apparatus further includes a removal circuit which is configured to remove the spreading code or the pseudo-random pilot signal at least partially from the amplified sensor signal. For this purpose, the removal circuit may be configured, for example, to demodulate the amplified sensor signal accordingly. Additionally, or alternatively, the removal circuit may have an n-bit digital-to-analog converter (DAC) for the pseudo-random pilot signal and may be configured to subtract an output signal of the n-bit DAC from the amplified sensor signal, where n corresponds to a number of bits of the spreading code or pseudo-random pilot signal. It is understood that the magnetic field generating circuit and the removal circuit should be synchronized with regard to the spreading code or the pseudo-random pilot signal. Alternative implementations of the removal circuit based on low-pass filters or bandpass filters are also possible.

According to some example implementations, the magnetic sensor apparatus further includes a bandgap reference circuit which is configured to generate a constant reference voltage with the target amplitude and/or an electrical excitation current for the magnetic field generating circuit with a constant current intensity. A bandgap reference (bandgap voltage reference) is a reference voltage source whose output voltage in the temperature-compensated state corresponds to the bandgap voltage of a semiconductor. The voltage generated thus varies depending on the semiconductor material: silicon, silicon carbide or gallium arsenide. A special feature of a bandgap reference is high precision with low outlay in terms of circuitry. In addition, bandgap references are temperature-stable.

According to some example implementations, the bandgap reference circuit has a resistor (virtually) independent of mechanical stress in order to generate a current (virtually) independent of mechanical stress. This can be, for example, a metal resistor or a silicided polysilicon resistor or combinations of resistors with different stress dependence, wherein the combination has a stress dependence <1%. Integrated circuits (ICs) often require integrated resistors for proper operation of the circuit. Such resistors are usually composed of doped polycrystalline silicon. In order to reduce the resistances and the dependence on mechanical stress in the polycrystalline resistors, a metal silicide layer can be formed on the top side of the doped polycrystalline silicon or the formation of such a layer on the top side of the doped polycrystalline silicon can be prevented. This option of the metal silicide allows two different types of resistors made of polycrystalline silicon. The first type with the metal silicide layer above the doped polycrystalline silicon is referred to as a "silicided polycrystalline silicon resistor" (silicided poly-resistor), and the electrical conduction of this resistor is effected via the metal silicide layer. The second type without the metal silicide layer above the doped polycrystalline silicon is referred to as a "non-silicided polycrystalline silicon resistor" (non-silicided poly-resistor). The electrical conduction of the second type is effected through the polycrystalline silicon, which depends on the doping (p-doped or n-doped) of the polycrystalline silicon.

According to some example implementations, the control circuit has a differential amplifier which is configured to output the setting signal for the supply signal and/or the amplifier circuit, based on a difference between the amplified signal amplitude and the target amplitude. The differential amplifier can be, for example, an operational amplifier or transconductance amplifier (Operational Transconductance Amplifier, OTA) which converts a differential voltage at its two inputs into a proportional output current (setting signal). An analog-to-digital converter is also possible for signal processing, the reference of which converter is controlled. This is also equivalent to gain or sensitivity control.

According to some example implementations, the target amplitude is a constant amplitude or an amplitude ratiometrically dependent on a supply voltage of the magnetic sensor apparatus. The term "ratiometric" in electronics means that an unknown variable can be derived from a known ratio of a plurality of other variables to each other. In general, during a ratiometric measurement as a quotient of two variables with the same superposed interference, it turns out that the latter does not influence the measurement. For example, a ratiometric measurement variable (such as a measured amplitude) is independent of a supply voltage (VDD) that may be subject to fluctuations. If, for example, the supply voltage rises unexpectedly at a measurement system, a measurement signal coupled linearly to the supply voltage thus also rises. However, the variable to be measured has not changed. If the measurement signal were then passed to an ADC (analog-to-digital converter) with a fixed reference voltage, the result would be that the ADC provides a code corresponding to a higher measurement variable—incorrect measurement—not a ratiometric system in this case. If the reference voltage of the ADC also rose linearly with respect to the supply, the variable to be measured would not change at the output of the ADC—correct measurement—since in this case there is a ratiometric system. Ratiometric therefore means that, if the measured signal changes due to an interference variable in the system, the comparison variable must change in the same way, such that the change as it were "cancels out" and the change remains with "1/1". The measurement signal is then multiplied by this fraction. The ratiometry is perfect with 1, is already poorer with 1.15, etc.

According to some example implementations, the magnetic sensor apparatus further includes a second magnetic field sensor circuit which is configured to output a second sensor signal which has a signal amplitude dependent (e.g., a second signal amplitude dependent) on a sensitivity of the second magnetic field sensor circuit. According to some example implementations, the magnetic sensor apparatus may further have a second amplifier circuit which is configured to amplify the second sensor signal and to output a second amplified sensor signal. The control circuit may be configured to use the setting signal to set a supply signal (e.g., a second supply signal) of the second magnetic field sensor circuit and/or a gain (e.g., a second gain) of the second amplifier circuit. Thus, the proposed concept can also be implemented using a replica signal path. The purpose of using a replica signal path may be to ensure that both signal paths always behave identically, even under varying environmental conditions. "Replica circuits" can not only be understood as meaning identical circuits (within the framework of manufacturing tolerances), but also so-called scalable replica circuits. For the latter, for example, a gain factor can differ between the two circuits (e.g., by virtue of different emitter areas or source-drain channels), with an otherwise identical implementation. Replica circuits on an IC have very good synchronization characteristics with each other, which are usually one order of magnitude better than changes over temperature, mechanical stress effects and lifetime drifts. According to some example implementations, the magnetic field sensor circuit and the second magnetic field sensor circuit as well as the amplifier circuit and the second amplifier circuit can thus each be in the form of replica circuits on a common chip.

According to some example implementations, the magnetic field generating circuit may be configured to generate the magnetic field for the magnetic field sensor circuit and the second magnetic field sensor circuit using a common mode signal (common mode WoC). In the case of symmetrical signal transmission, a common mode signal is superimposed on the actual useful signal. Common mode voltage signals can be referred to as common mode voltages. In the case of currents, reference can be made to the common mode current. Common mode signals for symmetrical signal transmission can be DC voltage or DC currents, while useful signals may be complementary AC voltages or currents superimposed on the common mode signal.

According to some example implementations, the magnetic field sensor circuit and the second magnetic field sensor circuit each include at least one Hall sensor. Alternatively, the magnetic field sensor circuit and the second magnetic field sensor circuit may each include at least one xMR sensor. The xMR sensor may be in the form of an xMR sensor bridge circuit and in particular a TMR sensor bridge circuit. TMR sensor bridge circuits may have a particularly pronounced sensitivity drift.

According to some example implementations, the amplifier circuit is in the form of a digital amplifier circuit with an adjustable digital gain. For example, the digital amplifier circuit may have an analog-to-digital converter (ADC) with a reference voltage (e.g., an adjustable reference voltage) that can be adjusted using the control circuit. In addition, a digital gain could also be set after analog-to-digital conversion of the signal.

A further aspect of the present disclosure proposes a method for compensating for sensitivity fluctuations of a magnetic field sensor circuit. The method includes generating a magnetic field, outputting, in response to the magnetic field, a sensor signal using the magnetic field sensor circuit, wherein the sensor signal has a signal amplitude dependent on a sensitivity of the magnetic field sensor circuit, amplifying the sensor signal in order to obtain an amplified sensor signal with an amplified signal amplitude, and setting a supply signal of the magnetic field sensor circuit and/or a gain of the amplifier circuit such that the amplified signal amplitude corresponds to a target amplitude.

Example implementations of the present implementation can solve the problem of the lifetime drift of Hall or xMR sensors (accuracy and stability of the sensitivity), which is caused mainly by mechanical stress. Circuit techniques with a pseudo-random magnetic pilot signal and feedback control loops can be used for stabilization. Example implementations of the present implementation may allow systems with low noise, high bandwidth, high accuracy and low offset at lower cost.

BRIEF DESCRIPTION OF THE DRAWINGS

Some examples of apparatuses and/or methods are explained in more detail merely by way of example below with reference to the accompanying figures, in which:

FIG. 1 shows an overview illustration of a magnetic sensor apparatus according to example implementations;

6

Figure 6A:
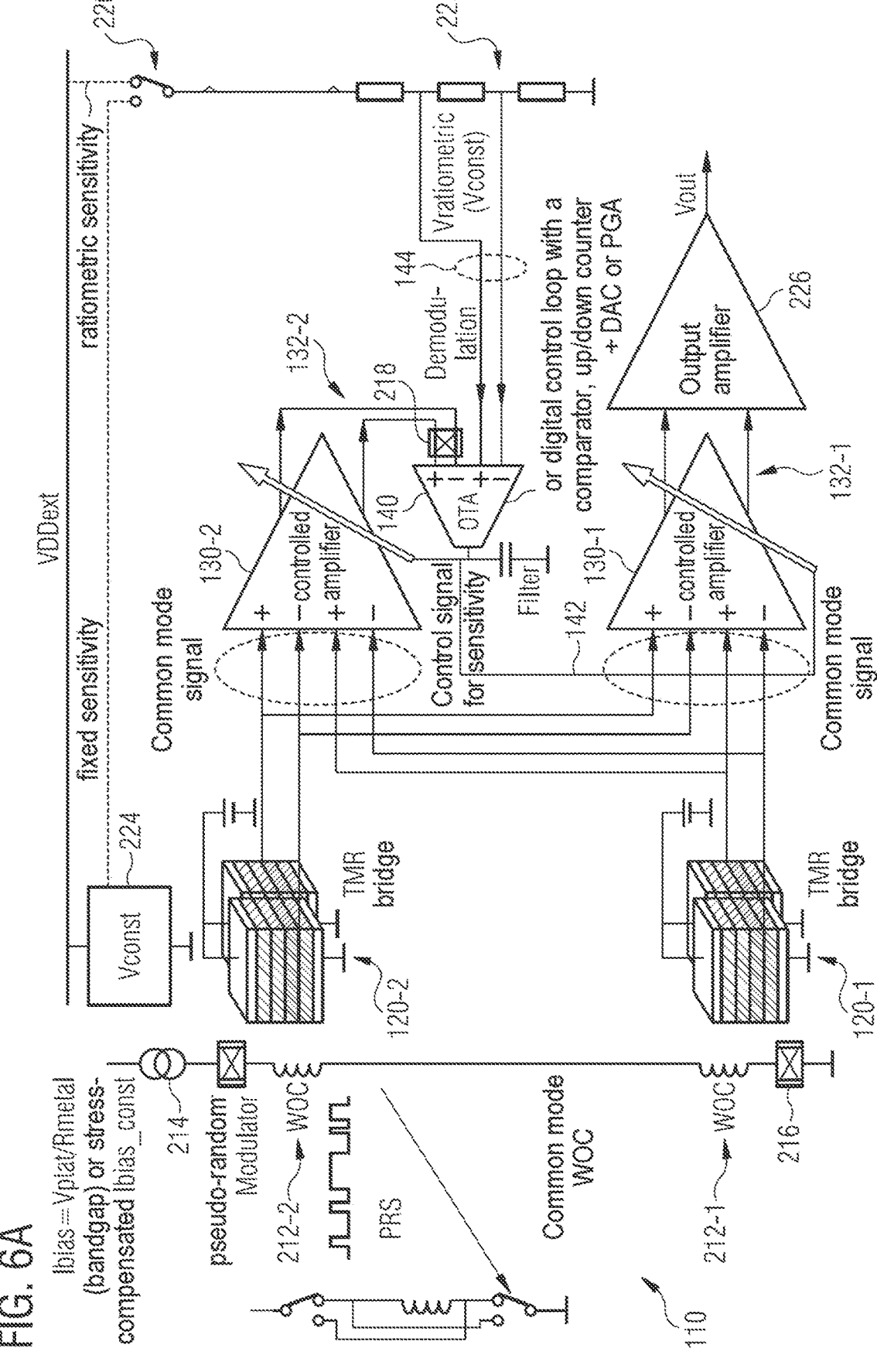
Figure 6B:
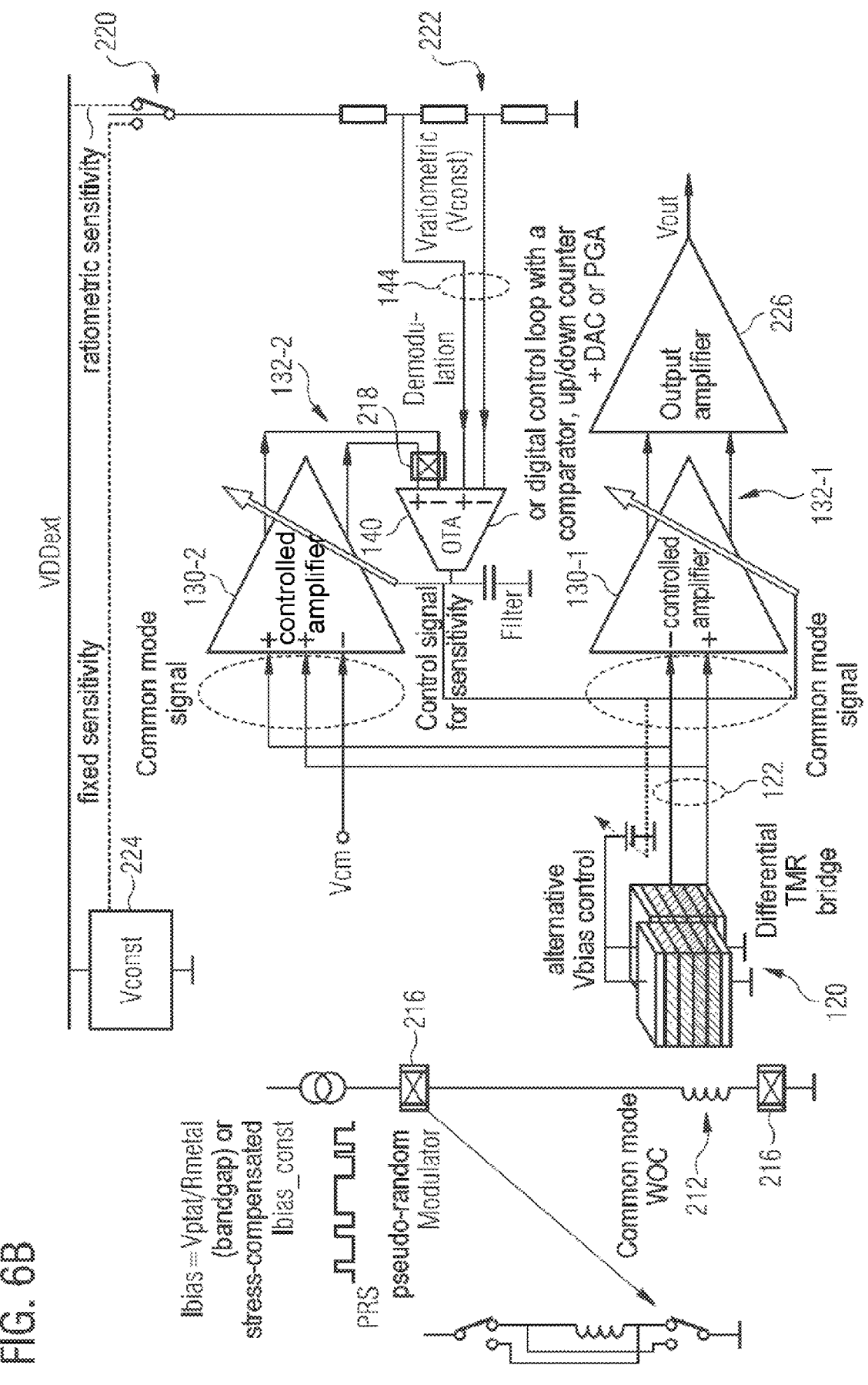
Figure 7:
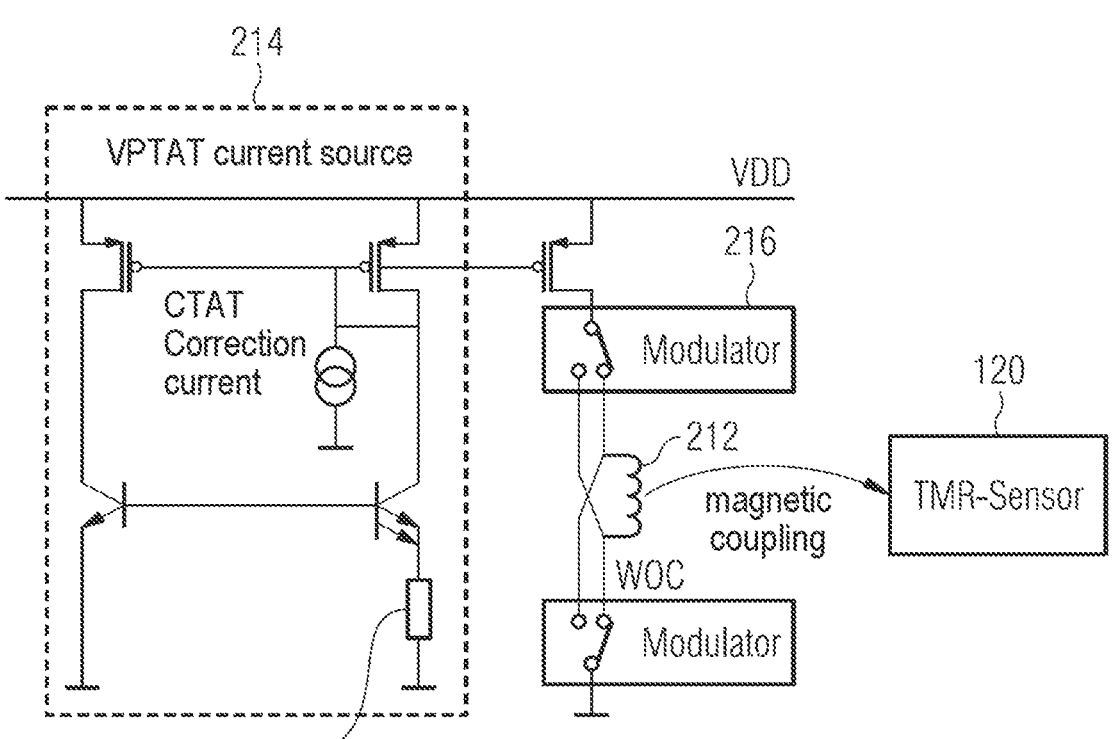
Figure 8A:
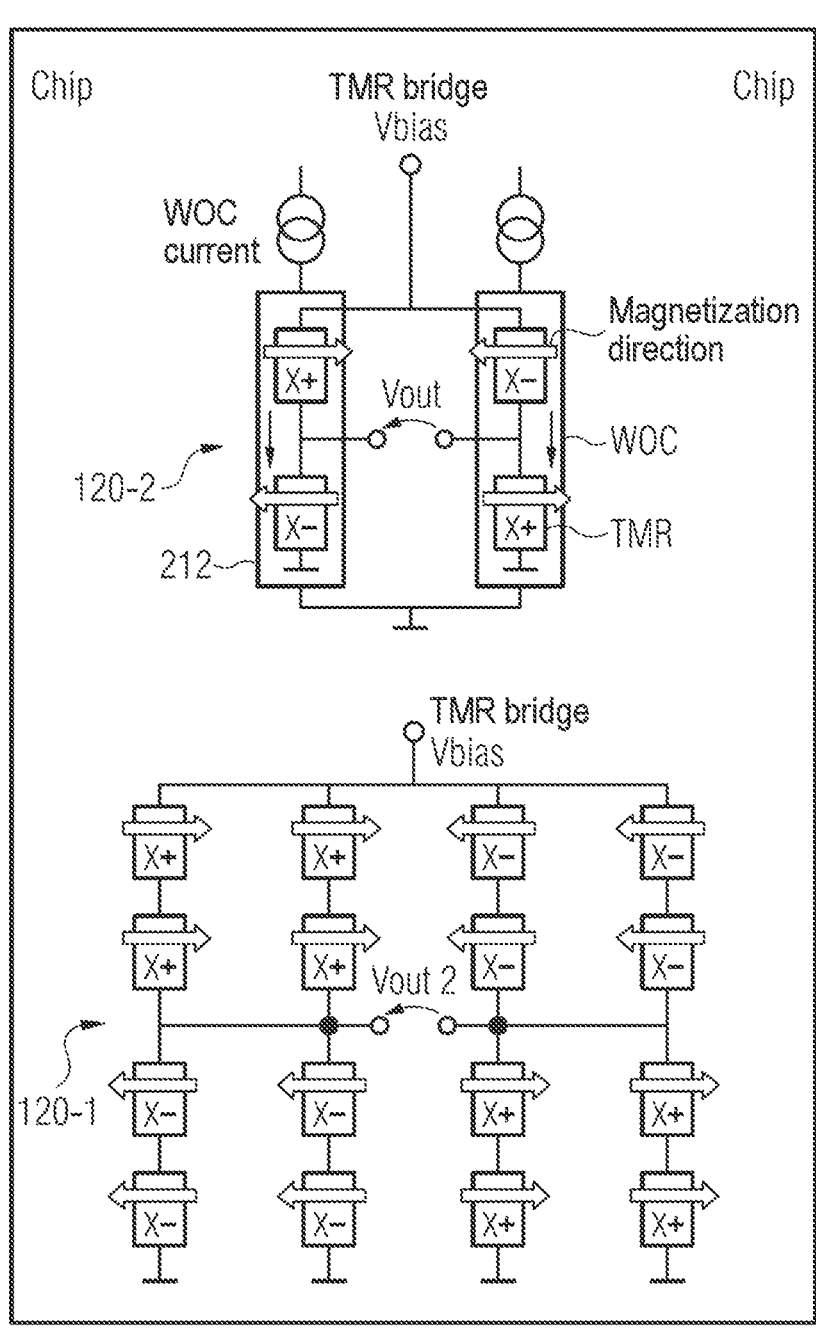
Figure 8B:
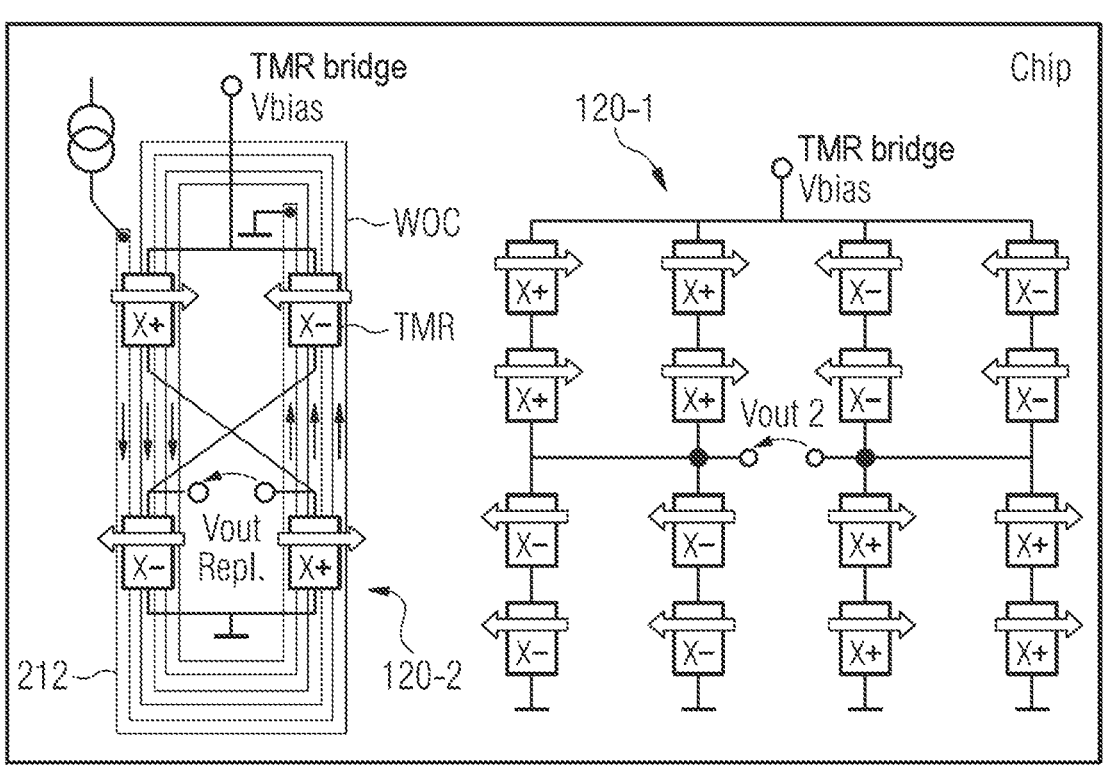
Figure 8C:
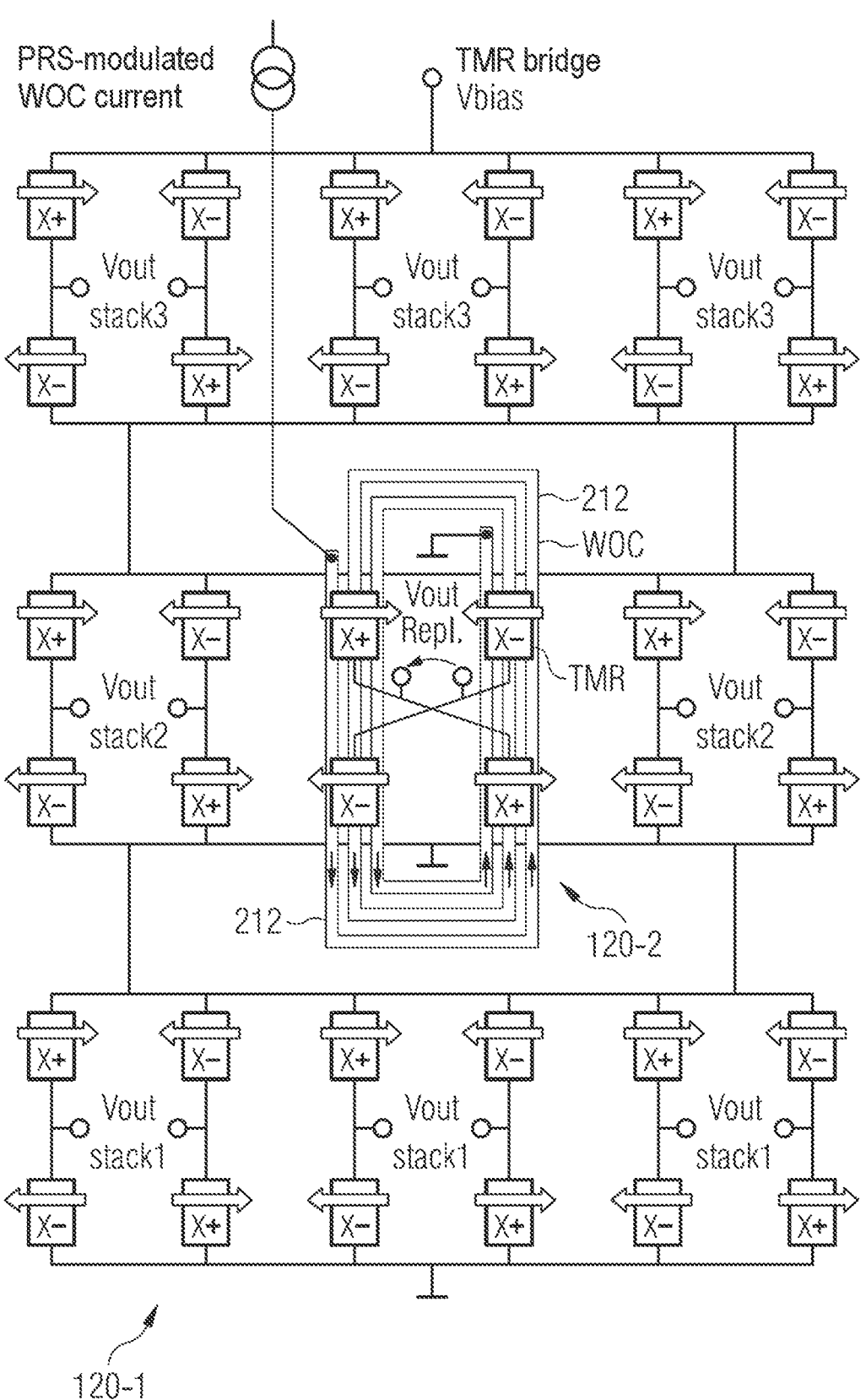
Figure 8D:
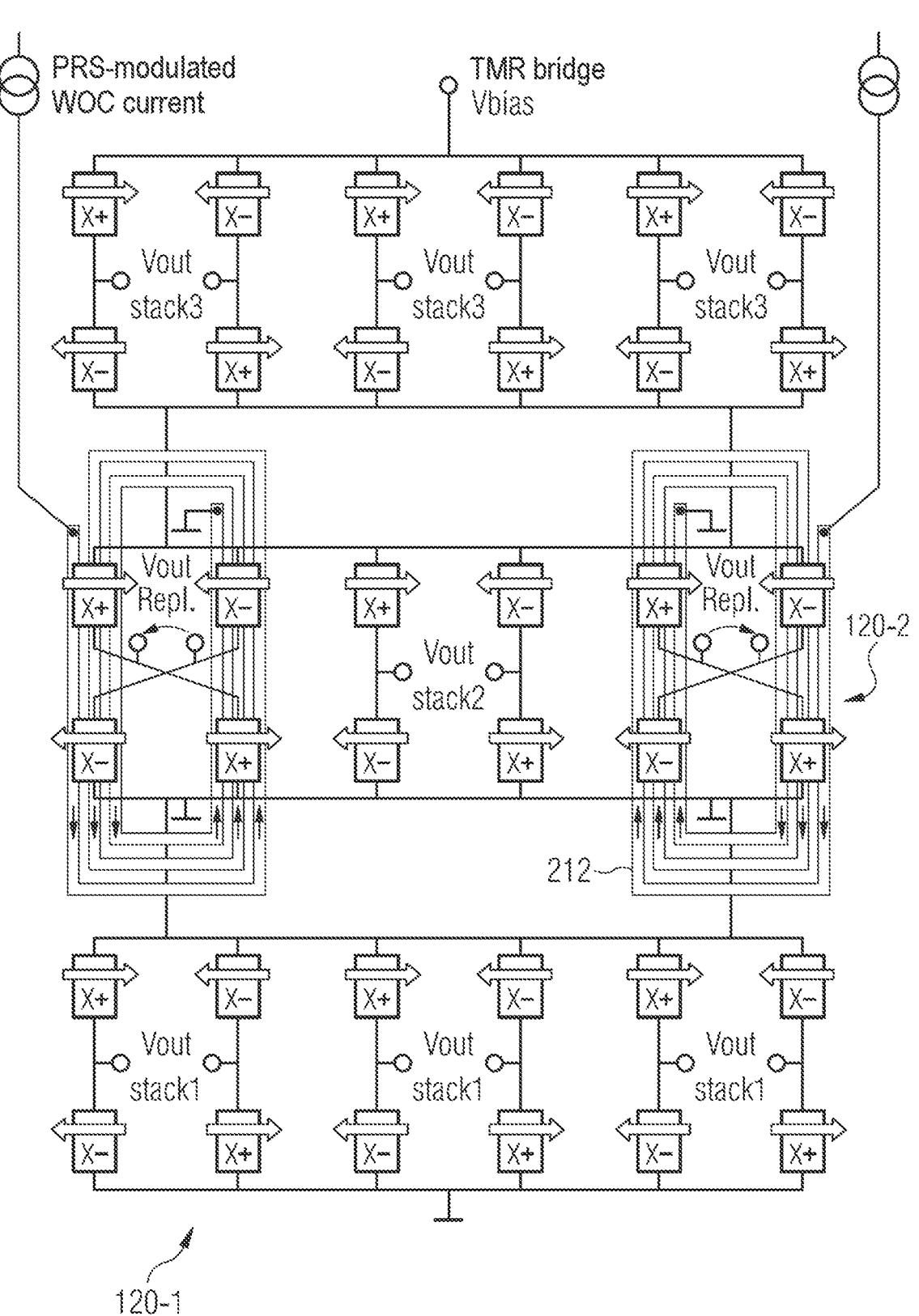

FIG. 6A shows a fifth example implementation of the magnetic sensor apparatus;

FIG. 6B shows a fifth example implementation of the magnetic sensor apparatus;

FIG. 7 shows an example of a stress-independent constant current source; and

FIGS. 8A-8D show different implementations of a first xMR sensor bridge circuit and a second (replica) xMR sensor bridge circuit with an associated current conductor on a chip.

DETAILED DESCRIPTION

Some examples are now described in more detail with reference to the accompanying figures. However, further possible examples are not limited to the features of these implementations described in detail. These may include modifications of the features, as well as equivalents and alternatives to the features. In addition, the terminology used herein to describe certain examples should not be restrictive for other possible examples.

Throughout the description of the figures, identical or similar reference signs relate to identical or similar elements or features, each of which may be implemented in an identical or modified form, while providing the same or a similar function. In the figures, the thicknesses of lines, layers and/or areas may also be exaggerated for clarity.

If two elements A and B are combined using an "or", this should be understood to mean that all possible combinations are disclosed, e.g., only A, only B, and A and B, unless explicitly defined otherwise in the individual case. As alternative wording for the same combinations, it is possible to use "at least one of A and B" or "A and/or B". This applies equivalently to combinations of more than two elements.

If a singular form, such as "a, an" and "the", is used, and the use of only a single element is neither explicitly nor implicitly defined as mandatory, other examples may also use a plurality of elements to implement the same function. If a function is described below as being implemented using a plurality of elements, further examples can implement the same function using a single element or a single processing entity. It is also understood that the terms "comprises", "comprising", "has" and/or "having" in their use describe the presence of the specified features, integers, steps, operations, processes, elements, components and/or a group thereof, but do not exclude the presence or addition of one or more other features, integers, steps, operations, processes, elements, components, and/or a group thereof.

Figure 1:
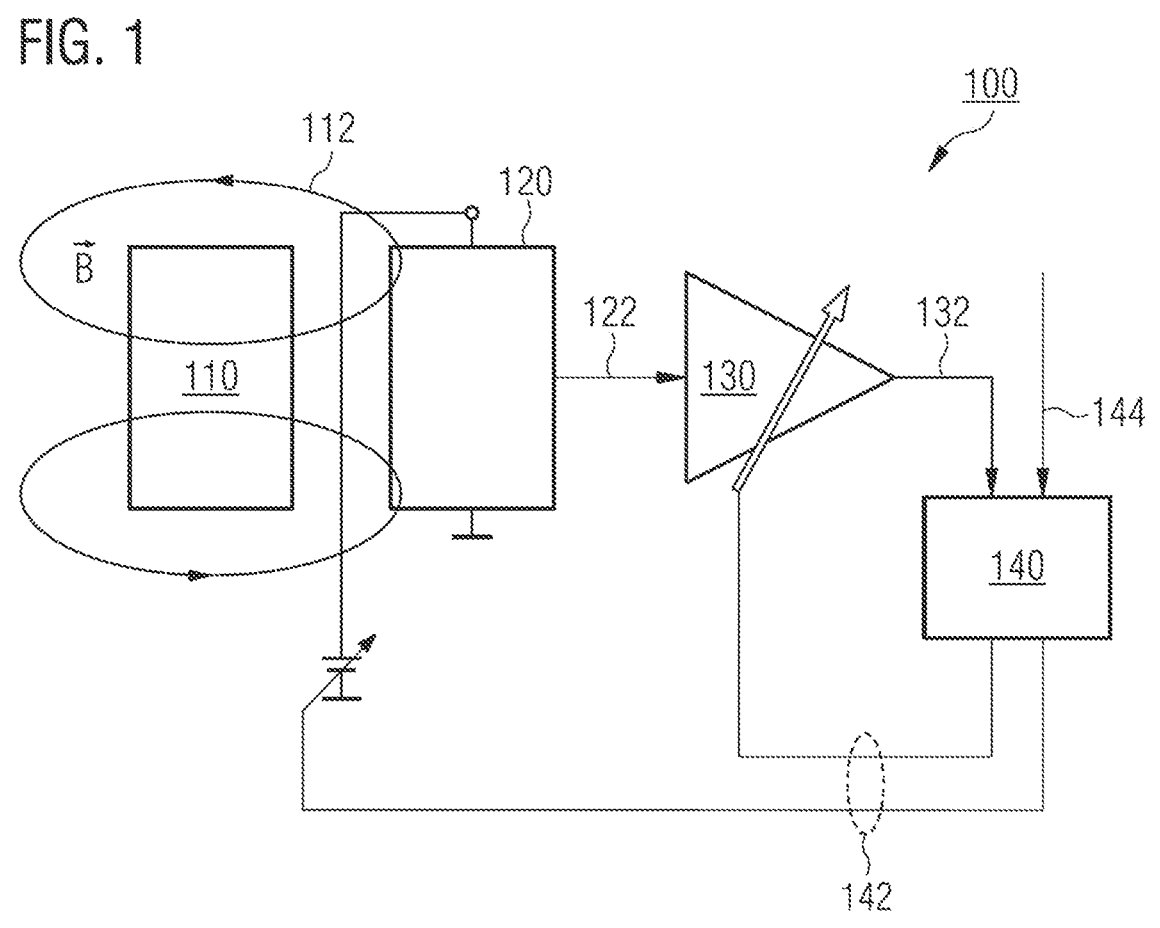

FIG. 1 shows an overview illustration of a magnetic sensor apparatus 100 according to one example implementation.

The magnetic sensor apparatus 100 comprises a magnetic field generating circuit 110 which is configured to generate a predefined magnetic field 112. A predefined magnetic field is understood here as meaning a magnetic field for trimming the measurement sensitivity of the magnetic sensor apparatus 100. The magnetic sensor apparatus 100 also comprises at least one magnetic field sensor circuit 120 which is configured to output a sensor signal 122 in response to the predefined magnetic field 112, which sensor signal has a signal amplitude dependent on a sensitivity (measurement sensitivity) of the magnetic field sensor circuit 120. An amplifier circuit 130 of the magnetic sensor apparatus 100 is configured to amplify the sensor signal 122 of the magnetic field sensor circuit 120 and to output an amplified sensor signal 132 with an amplified signal amplitude on the output side. The amplifier circuit 130 can also be an analog-to-digital converter with subsequent digital signal processing. A control circuit 140 is configured to use a setting signal 142 to set a supply signal of the magnetic field sensor circuit 120 and/or a gain of the amplifier circuit 130 or the reference of an ADC or the gain of digital signal processing following the ADC such that the amplified signal amplitude corresponds to a target amplitude 144. The amplified signal amplitude of the amplified sensor signal 132 is thus controlled to the target amplitude 144 by the control circuit 140.

The magnetic field sensor circuit 120 may be in the form of a Hall or xMR sensor circuit, in particular xMR sensor bridge circuit. xMR sensor bridge circuits as a magnetic field sensor circuit 120 are discussed in more detail merely by way of example below.

The circuit components of the magnetic sensor apparatus 100 can be integrated together on a chip, for example. Numerous different circuit implementations of the magnetic sensor apparatus 100 are possible. Some example implementations are described with reference to the figures below.

Figure 2:
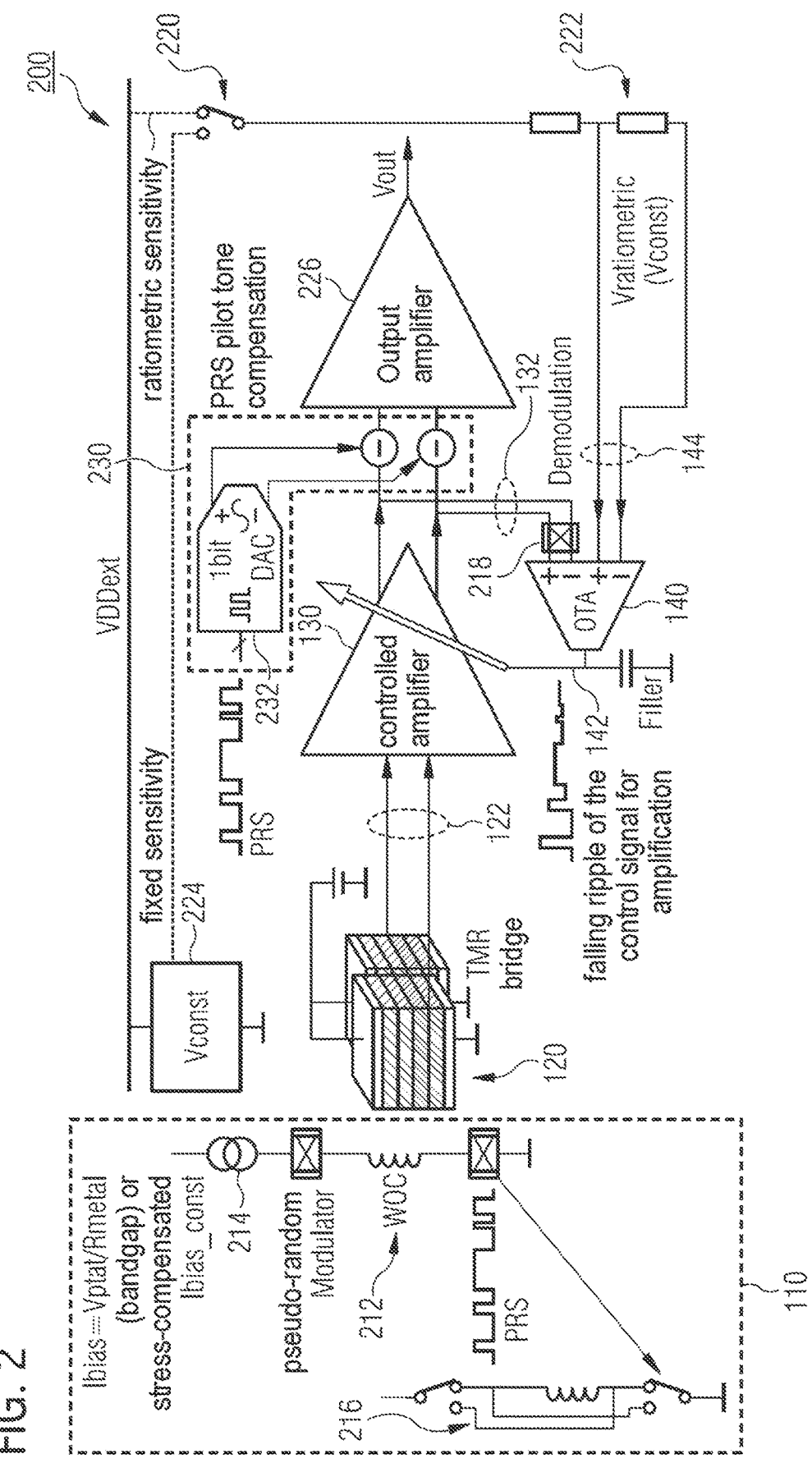
FIG. 2 shows a first example implementation of the magnetic sensor apparatus.

FIG. 2 shows a magnetic sensor apparatus 200 according to a first possible implementation.

The magnetic field generating circuit 110 of the magnetic sensor apparatus 200 shown in FIG. 2 has a current conductor 212 for conducting a predefined electrical excitation current to flow through the current conductor 212. The predefined electrical excitation current is provided by a current source 214 and has at least a predefined (e.g., known) current intensity. Thus, the magnetic field 112 generated thereby then also becomes a predefined magnetic field. The current source 214 may have a bandgap reference circuit having a resistor independent of mechanical stress (e.g., metal resistor or silicided polysilicon resistor or a combination of resistors with different stress dependence) in order to generate the electrical excitation current with a constant, stress-independent current intensity. A possible implementation is shown schematically in FIG. 7.

The current conductor 212 can be, for example, a busbar, a conductor loop or a coil. If a predefined electrical current flows through the current conductor 212, a predefined magnetic field 112 that is dependent on the electrical current is formed around the current conductor 212. This predefined magnetic field 112 can then be detected and measured by the xMR sensor bridge circuit 120 which is arranged in the vicinity of the current conductor 212. The measured magnetic field can then be used in turn to infer the current, with the result that the (trimmed) xMR sensor bridge circuit 120 can be used, for example, as a current sensor. According to some example implementations, the current conductor 212 and the xMR sensor bridge circuit 120 can be arranged on a common semiconductor chip (WoC).

In the example implementation shown in FIG. 2, the magnetic field generating circuit 110 is configured to generate the magnetic field (e.g., in a trimming mode of the magnetic sensor apparatus 200) according to an alternating excitation current (AC=alternating current) with a defined amplitude and frequency. Thus, the predefined AC magnetic field can be superimposed, for example, on a DC magnetic field or another AC magnetic field as a useful signal. The alternating excitation current—and thus the AC magnetic field—can be generated according to some example implementations according to a predefined or pseudo-random spreading code which consists of a sequence of pulses or chips (chip=a single elementary modulation state). If the pulse or chip rate (frequency) of the spreading code is sufficiently high, a frequency spectrum of the magnetic field is widened in such a way that it can no longer be distinguished from noise.

The alternating excitation current can be generated or modulated according to some example implementations according to a pseudo-random pilot or spreading signal (pseudo-random signal, PRS). The pseudo-random pilot signal (spreading code) can be a pseudo-random digital n-bit signal (n≥1). The alternating excitation current through the current conductor 212 can be generated by modulating a DC current. One example of a modulation circuit 216 is shown in FIG. 2. If the switches of the modulation circuit 216 are in the position illustrated in FIG. 2, current flows through the coil (conductor loop). When the switch position is changed, no current flows through the coil. For example, the excitation current can be switched on and off according to a binary pseudo-random pilot signal and can thereby generate a corresponding AC magnetic field.

The predefined magnetic field is measured by the xMR sensor bridge circuit 120 and a sensor signal 122 which depends on the magnetic field is output. The sensor signal 122 is shown in this example implementation as a differential (symmetrical) signal. It is understood that the sensor signal 122 could also be asymmetrical (single-ended). The xMR sensor bridge circuit 120 is in the form of a TMR sensor bridge circuit in this example implementation. It is understood that the xMR sensor bridge circuit 120 could also be in the form of an AMR or GMR sensor bridge circuit, for example. For TMR sensors, however, the concept of sensitivity drift compensation proposed herein proves to be particularly effective.

The sensor signal 122 of the xMR sensor bridge circuit 120 is supplied to an input of a first amplifier 130. The first amplifier 130 (e.g., a preamplifier) amplifies the sensor signal 122 and outputs an amplified sensor signal 132 at its output. The amplified sensor signal 132 is shown in this example implementation as a differential (symmetrical) signal. Accordingly, the first amplifier 130 is in the form of a differential amplifier. It is understood that the amplified sensor signal 132 and the first amplifier 130 could also be asymmetrical (single-ended).

The amplified sensor signal 132 is supplied as a control variable to an analog controller 140 in the form of a differential amplifier in the example implementation shown. The differential amplifier 140 is in the form of a transconductance amplifier (OTA) here. Other forms of controllers are also conceivable and depend on the specific implementation. For example, the analog control circuit illustrated here could also be digital. That is to say, instead of an analog control loop (with OTAs and capacitors), it is also possible to use a digital control loop (comparator+up/down counter+DAC or PGA (=Programmable Gain Amplifier)) in order to allow low filter frequencies in the loop and thus better suppression of EMC and intermodulation effects.

On the input side of a first (differential) input of the controller (OTA) 140 there is a demodulation circuit 218 which is configured to convert the amplified (spread) AC sensor signal 132 into a (de-spread) DC signal which is then supplied to the first (differential) input of the differential amplifier 140. In the demodulation circuit 218, de-spreading is effected by correlating the amplified sensor signal 132 with the pilot or spreading signal. A target signal corresponding to a target amplitude 144 is supplied to a second (differential) input of the differential amplifier 140. This can be a DC signal, such as a DC voltage. A switch 220 can be used to set whether the target amplitude 144 is a constant amplitude or an amplitude ratiometrically dependent on a supply voltage VDDext of the magnetic sensor apparatus 200. In the first case, a voltage divider 222, which is coupled to the second (differential) input of the differential amplifier

140 on the output side, is coupled to a constant voltage source 224 on the input side. The constant voltage source 224 can be a bandgap reference circuit which is configured to generate a constant reference voltage Vconst with the target amplitude. The electrical excitation current for the magnetic field generating circuit 110 with a constant current intensity can also be derived from the constant voltage source 224 by virtue of the latter having, for example, a resistor independent of mechanical stress in order to generate an excitation current independent of mechanical stress. In the second case (ratiometric), the voltage divider 222 is coupled to the supply voltage VDDext of the magnetic sensor apparatus 200 on the input side via the switch 220.

The differential amplifier (OTA) 140 is configured to output the setting signal 142 for the first amplifier 130, based on a difference between its two input signals (amplified signal amplitude and target amplitude). A differential voltage at the two inputs of the differential amplifier 140 is thus converted into a proportional output current (setting signal 142) which is used to set the gain of the first amplifier 130 such that the differential voltage at the two inputs of the differential amplifier 140 becomes zero if possible—the amplified signal amplitude and the target amplitude are therefore substantially the same.

Between the first amplifier 130 and a second, downstream amplifier 226 (e.g., output amplifier), the magnetic sensor apparatus 200 has a removal circuit 230 which is configured to remove the pilot or spreading signal at least partially from the amplified sensor signal 132. For this purpose, the removal circuit 230 in the example implementation shown has a 1-bit DAC 232 for the pilot or spreading signal and is configured to subtract an output signal of the 1-bit DAC 232 from the amplified sensor signal 132. In particular, the 1-bit DAC 232 converts the digital 1-bit pilot or spreading signal into a (differential) analog signal. This analog spreading signal is then subtracted from the amplified sensor signal 132 which also contains the spreading signal. If the amplitude of the analog spreading signal at the output of the DAC 232 and the amplitude of the spreading signal contained in the amplified sensor signal 132 match, substantially complete removal of the spreading signal from the amplified sensor signal 132 takes place. The signal remaining after this corresponds, for example, to a measured DC magnetic field and can be amplified by the output amplifier 226 for further processing. It is understood that the modulation circuit 216 and the removal circuit 230 should be synchronized.

A possibly remaining small spreading signal at the input of the output amplifier 226, which comes from a mismatch of the analog spreading signal at the output of the DAC 232 to the spreading signal contained in the amplified sensor signal 132, can be compensated for by a second demodulator (not shown) which finally sets an amplitude of the DAC 232. Additionally, or alternatively, possible remaining harmonics of the spreading signal at the output can be compensated for by a low-pass filter at the output of the DAC 232 or at the input of the output amplifier 226. This low-pass filter can have the same bandwidth as the preamplifier 130.

In summary, FIG. 2 shows an implementation of TMR sensor stabilization of the sensitivity with a pseudo-random (spread spectrum) pilot tone for wire-on-chip (WoC) and pilot tone compensation at the output amplifier. The control loop may have a controllable amplifier or digitally programmable amplifier 130.

Figure 3:
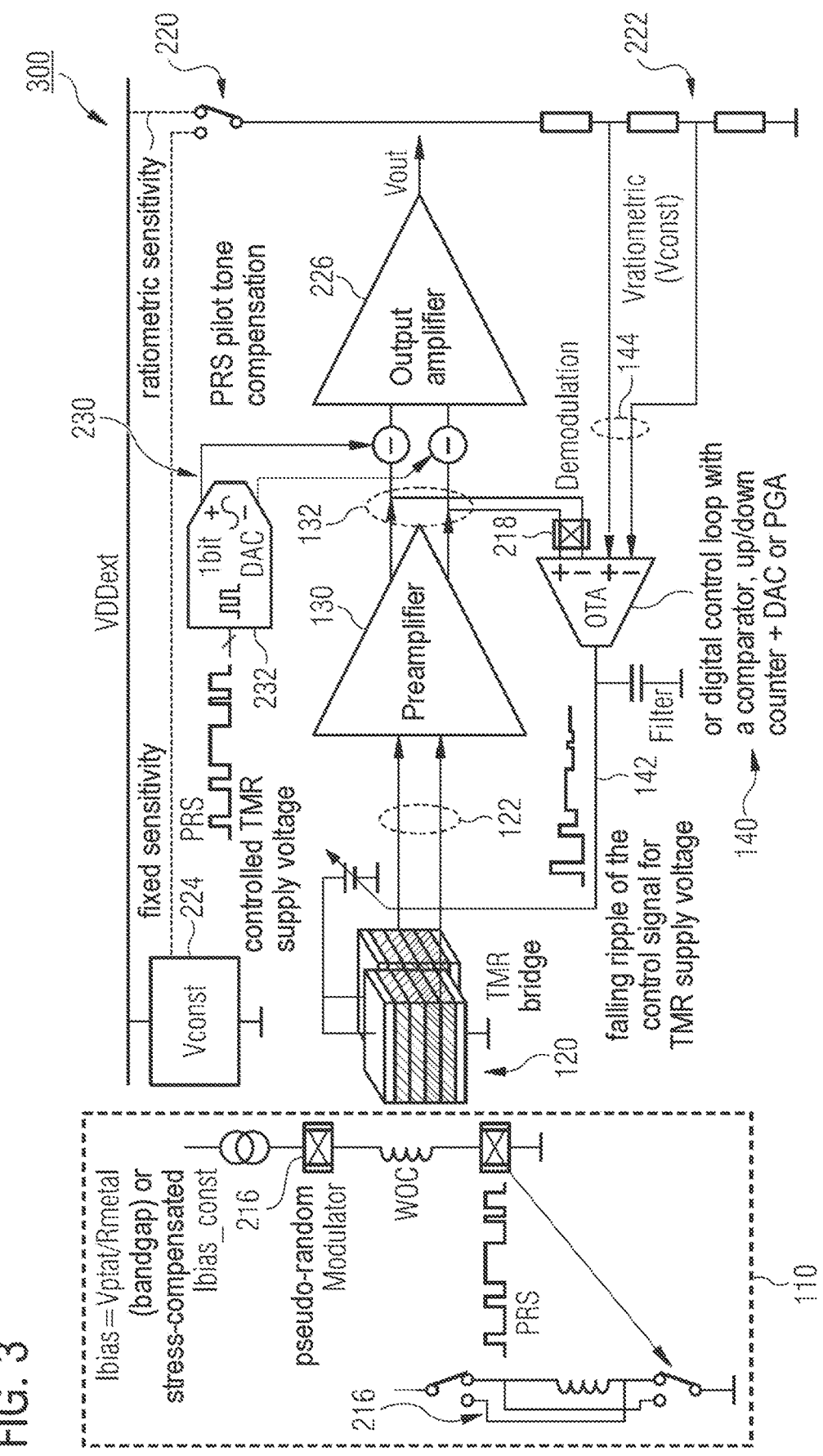
FIG. 3 shows a second example implementation of the magnetic sensor apparatus.

FIG. 3 shows a further implementation of a magnetic sensor apparatus 300 which differs from the magnetic sensor apparatus 200 only by the implementation of the control circuit. Whereas the gain of the amplifier 130 can be controlled using the setting signal 142 in the control circuit in FIG. 2, a supply voltage of the xMR sensor bridge circuit 120 can be controlled using the setting signal 142 in the control circuit according to FIG. 3, as a result of which the sensitivity of the TMR bridge sensor can be proportionally controlled. The gain of the (pre-) amplifier 130 is constant here.

The principle of the circuits according to FIGS. 3 and 4 can be summarized as follows. A pseudo-random pilot tone is inserted into the WoC of an xMR bridge 120. The amplitude of the obtained WoC signal is demodulated downstream of the preamplifier 130 and is compared with a target amplitude 144. A control signal 142 is derived from this comparison, which control signal controls either the supply voltage of the xMR bridge 120 or the gain of the preamplifier 130. The pilot signal is then subtracted from the signal path again using a 1-bit DAC in order to obtain a clean output signal without superimposed pilot tones.

Figure 4:
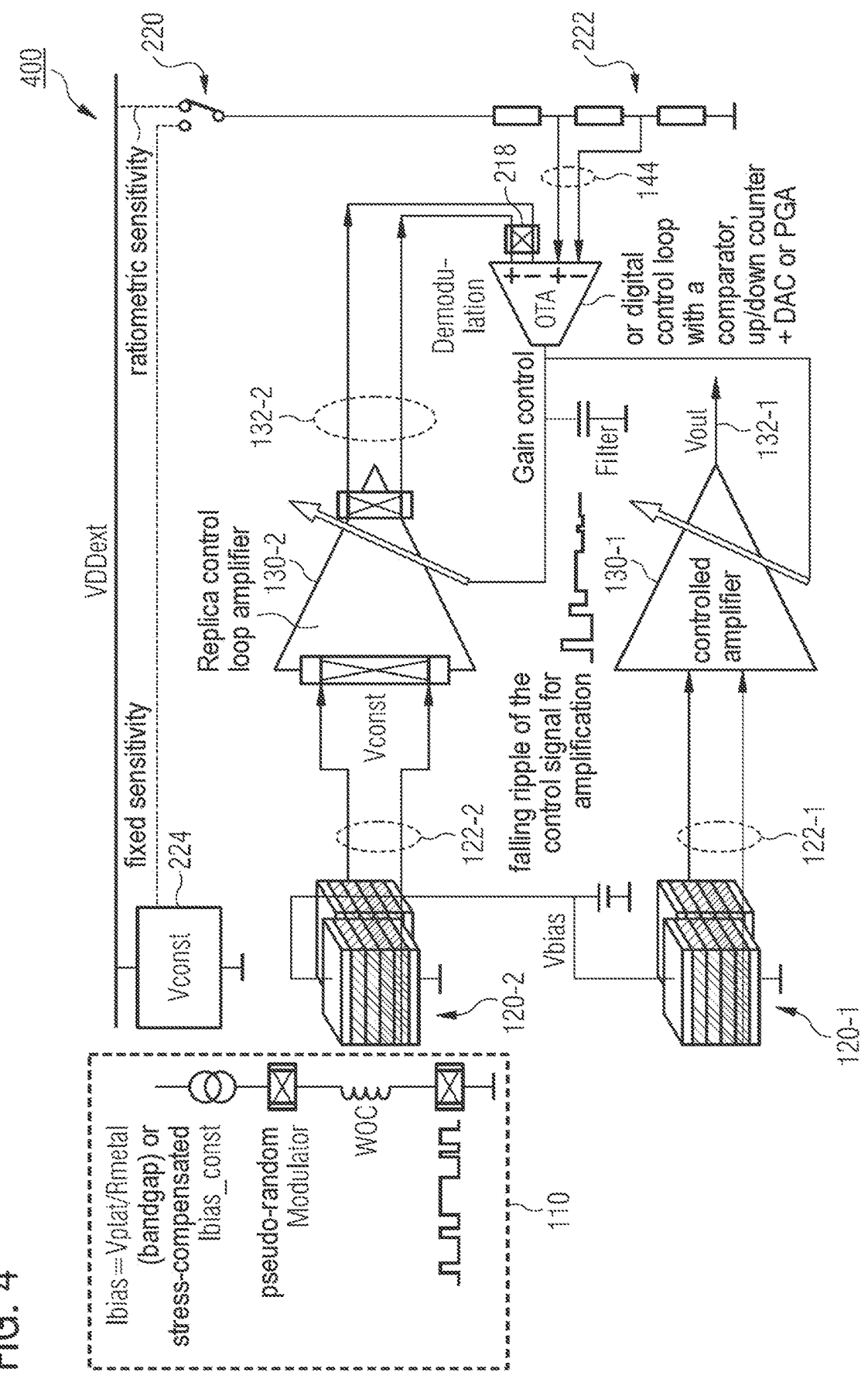
FIG. 4 shows a third example implementation of the magnetic sensor apparatus.

FIG. 4 shows an implementation of a magnetic sensor apparatus 400 with two signal paths. A first signal path comprises a first xMR sensor bridge circuit 120-1 which outputs a first (differential) sensor signal 122-1 in response to a magnetic field to be measured. The first (differential) sensor signal 122-1 is supplied to a (differential) input of a first controllable amplifier 130-1 in order to obtain a first amplified sensor signal 132-1 at its output. A second signal path comprises a second xMR sensor bridge circuit 120-2 which outputs a second (differential) sensor signal 122-2 in response to a predefined trimming magnetic field. The trimming magnetic field can in turn be an AC magnetic field according to a spreading code. The second (differential) sensor signal 122-2 is supplied to a (differential) input of a second controllable amplifier 130-2 in order to obtain a second amplified sensor signal 132-2 at its output. The second signal path is a replica signal path to the first signal path. The first and second xMR sensor bridge circuits 120-1, 120-2 are therefore replica circuits (e.g., formed as a first replica circuit formed on a common chip). The first and second amplifiers 130-1, 130-2 are also replica circuits (e.g., formed as a second replica circuit formed on the common chip). The replica circuits can be implemented together on a chip (die).

As indicated in FIG. 4, the second amplifier 130-2 may be in the form of a chopper amplifier. Chopper amplifiers are a type of amplifier in which a signal to be amplified is modulated (chopped), amplified and demodulated again. Using such a technique makes it possible to shift a zero-point error (or offset error) and so-called 1/f noise of an amplifier into a frequency band that is not of interest.

The second amplified sensor signal 132-2 is supplied in the example implementation shown to a differential amplifier 140 in the form of a transconductance amplifier (OTA) which functions as an analog controller. Other forms of differential amplifiers are also conceivable and depend on the specific implementation. For example, the analog control circuit illustrated here could also be in the form of a digital control loop.

On the input side of a first (differential) input of the differential amplifier (OTA) 140 there is a demodulation circuit 218 which is configured to convert the second amplified (spread) AC sensor signal 132-2 into a (de-spread) DC signal which is then supplied to the first (differential) input of the differential amplifier 140. A target signal corresponding to a target amplitude 144 is supplied to a second (differential) input of the differential amplifier 140. The switch 220 can be used to set whether the target amplitude 144 is a constant amplitude or an amplitude ratiometrically dependent on a supply voltage VDDext of the magnetic sensor apparatus 200.

The differential amplifier 140 is configured to output a setting signal 142 for both replica amplifiers 130-1 and 130-2, based on a difference between its two input signals (amplified signal amplitude and target amplitude). A differential voltage at the two inputs of the differential amplifier 140 is thus converted into a proportional output current (setting signal 142) which is used to set the gain of the two identical amplifiers 130-1, 130-2 such that the differential voltage at the two inputs of the differential amplifier 140 becomes zero if possible—the amplified signal amplitude and the target amplitude are therefore substantially the same. This example implementation assumes that both replica sensor bridge circuits 120-1, 120-2 and the TMR bridges 120-1, 120-2 behave almost identically with respect to the sensitivity drift to be compensated for, e.g., their gain differences are <1%.

Figure 5:
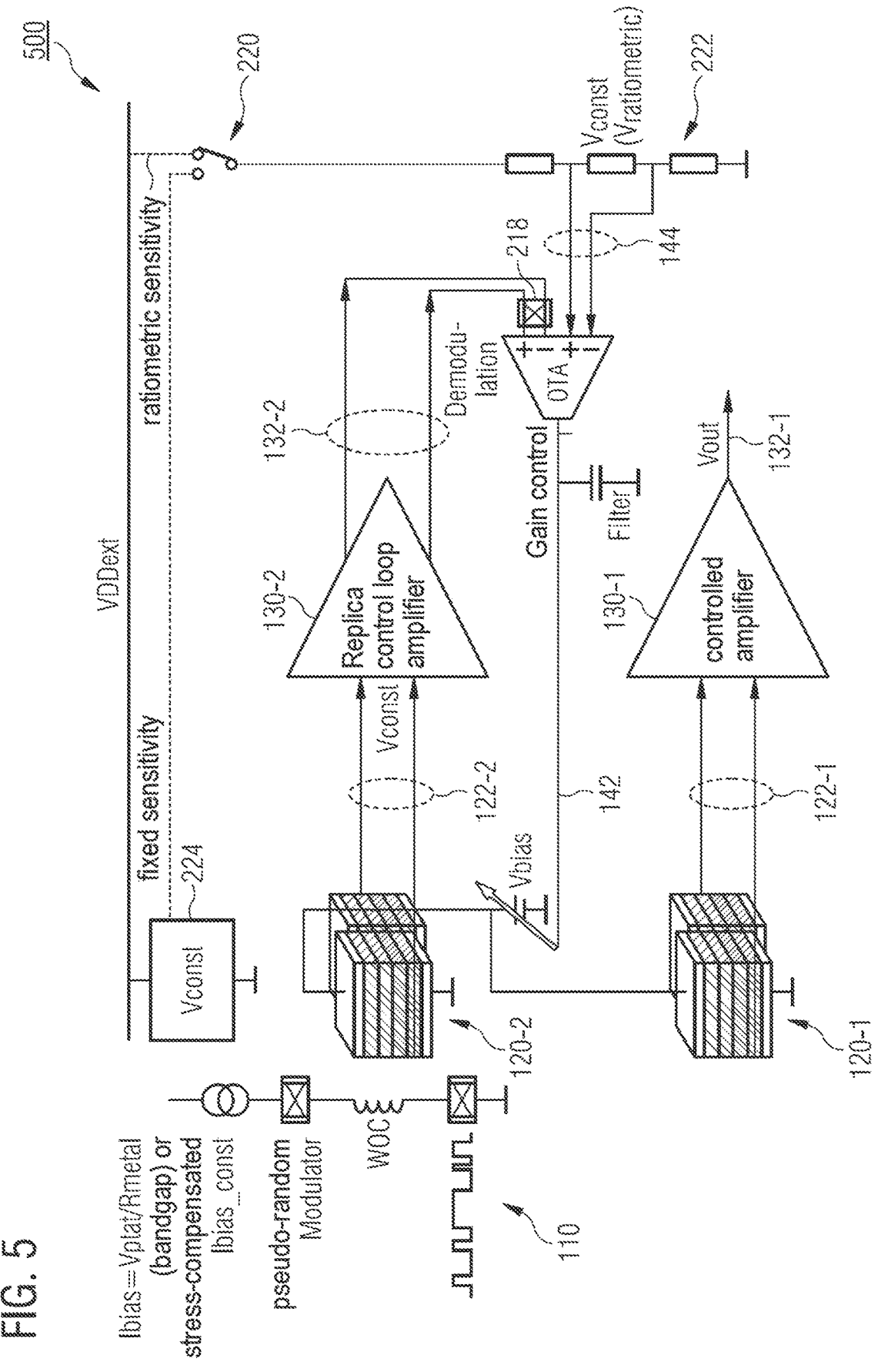
FIG. 5 shows a fourth example implementation of the magnetic sensor apparatus.

FIG. 5 shows a further implementation of a magnetic sensor apparatus 500 which differs from the magnetic sensor apparatus 400 only by the implementation of the control circuit. Whereas the gain of the two replica amplifiers 130-1, 130-2 can be controlled using the setting signal 142 in the control circuit in FIG. 4, a common supply voltage of the replica sensor bridge circuits 120-1, 120-2 can be controlled using the setting signal 142 in the control circuit according to FIG. 5. The gains of the two (pre-)amplifiers 130-1, 130-2 are constant here.

FIG. 6A shows a further implementation of a magnetic sensor apparatus 600 with two xMR sensor bridge circuits 120-1, 120-2 which are configured as a differential sensor in order to obtain a useful signal from the difference between the sensor signals 122-1, 122-2 of the two xMR sensor bridge circuits 120-1, 120-2. The magnetic field generating circuit 110 is configured to generate a first (predefined) magnetic field 112-1 for the first xMR sensor bridge circuit 120-1 and a second (predefined) magnetic field 112-2 for the second xMR sensor bridge circuit 120-2 using a mutual common mode signal. The first xMR sensor bridge circuit 120-1 is thus assigned a first current conductor 212-1 for generating the first (predefined) magnetic field 112-1. The second xMR sensor bridge circuit 120-2 is assigned a second current conductor 212-2 for generating the second (predefined) magnetic field 112-2. In this case, 212-1, 212-2 can also refer to different sections of a current conductor. The common mode signal can be an excitation current modulated using the spreading code.

The first xMR sensor bridge circuit 120-1 outputs a first (differential) sensor signal 122-1 in response to the first predefined magnetic field 112-1. The first sensor signal 122-1 is supplied to both the first controllable amplifier 130-1 and the second controllable amplifier 130-2. The second xMR sensor bridge circuit 120-2 outputs a second (differential) sensor signal 122-2 in response to the second predefined magnetic field 112-2. The second sensor signal 122-2 is supplied to both the second controllable amplifier 130-2 and the first controllable amplifier 130-1. Whereas the first amplifier 130-1 amplifies a differential signal (useful signal) composed of the first and second sensor signal 122-1, 122-2, the second amplifier 130-2 amplifies a sum signal composed of the first and second sensor signal 122-1, 122-2. The common mode signal disappears in the differential signal (useful signal), with the result that a first amplified sensor signal 132-1 (useful signal) without a common mode signal component is obtained at the output of the first controllable amplifier 130-1. In the sum signal at the input of the second amplifier 130-2, the common mode signal is present, with the result that a second amplified sensor signal 132-2 with a common mode signal component (according to the spreading code) is obtained at the output of the second controllable amplifier 130-2. In a similar manner to that in the example implementations described above—this can be supplied to a controller.

The second amplified sensor signal 132-2 is supplied to the differential amplifier 140 which functions as an analog controller. Other forms of differential amplifiers are also conceivable and depend on the specific implementation. For example, the analog control circuit illustrated here could also be digital.

On the input side of the first (differential) input of the differential amplifier (OTA) 140 there is the demodulation circuit 218 which is configured to convert the second amplified (spread) AC sensor signal 132-2 into a (de-spread) DC signal which is then supplied to the first (differential) input of the differential amplifier 140. The target signal corresponding to the target amplitude 144 is supplied to the second (differential) input of the differential amplifier 140. The switch 220 can be used to set whether the target amplitude 144 is a constant amplitude or an amplitude ratiometrically dependent on a supply voltage VDDext of the magnetic sensor apparatus 200.

The differential amplifier 140 is configured to output the setting signal 142 for both amplifiers 130-1 and 130-2, based on a difference between its two input signals (amplified signal amplitude and target amplitude). A differential voltage at the two inputs of the differential amplifier 140 is thus converted into a proportional output current (setting signal 142) which is used to set the gain of the two identical amplifiers 130-1, 130-2 such that the differential voltage at the two inputs of the differential amplifier 140 becomes zero if possible—the amplified signal amplitude and the target amplitude are therefore substantially the same. This example implementation assumes that both sensor bridge circuits 120-1, 120-2 behave identically with respect to the sensitivity drift to be compensated for.

Whereas the gain of the two amplifiers 130-1, 130-2 can be controlled using the setting signal 142 in the control circuit in FIG. 6A, the supply voltages of the sensor bridge circuits 120-1, 120-2 can also be controlled using the setting signal 142. The gains of the two (pre-)amplifiers 130-1, 130-2 can then be constant.

FIG. 6B shows a further implementation of a magnetic sensor apparatus 700 with an xMR sensor bridge circuit 120 configured as a differential sensor. The magnetic field generating circuit 110 is configured to generate a (predefined) common mode AC magnetic field 112 for the xMR sensor bridge circuit 120 according to a spreading code, which magnetic field is not visible in the differential useful signal.

The xMR sensor bridge circuit 120 outputs a differential sensor signal 122 in response to the differential useful signal, while the predefined common mode AC magnetic field 112 affects only in total (as a common mode AC signal) the xMR sensor bridge circuit 120. The sensor signal 122 is supplied to the first controllable amplifier 130-1 as a differential signal (useful signal) and to the second controllable amplifier 130-2 as a sum signal. The common mode signal according to the spreading code does not appear in the differential signal (useful signal), with the result that a first amplified sensor signal 132-1 (useful signal) without a common mode signal component is obtained at the output of the first controllable amplifier 130-1. In the sum signal at the input of the second amplifier 130-2, the common mode signal is present, with the result that a second amplified sensor signal 132-2 with a common mode signal component (according to the spreading code) is obtained at the output of the second controllable amplifier 130-2. The second amplified sensor signal 132-2 is supplied to the differential amplifier 140. Other forms of differential amplifiers are also conceivable and depend on the specific implementation. For example, the analog control circuit illustrated here could also be digital. On the input side of the first (differential) input of the differential amplifier (OTA) 140 there is the demodulation circuit 218 which is configured to convert the second amplified (spread) AC sensor signal 132-2 into a (de-spread) DC signal which is then supplied to the first (differential) input of the differential amplifier 140. The target signal corresponding to the target amplitude 144 is supplied to the second (differential) input of the differential amplifier 140. The switch 220 can be used to set whether the target amplitude 144 is a constant amplitude or an amplitude ratiometrically dependent on a supply voltage VDDext of the magnetic sensor apparatus 200. The differential amplifier 140 is configured to output the setting signal 142 for both amplifiers 130-1 and 130-2, based on a difference between its two input signals (amplified signal amplitude and target amplitude). A differential voltage at the two inputs of the differential amplifier 140 is thus converted into a proportional output current (setting signal 142) which is used to set the gain of the two amplifiers 130-1, 130-2 such that the differential voltage at the two inputs of the differential amplifier 140 becomes zero if possible—the amplified signal amplitude and the target amplitude are therefore substantially the same.

Whereas the gain of the two amplifiers 130-1, 130-2 can be controlled using the setting signal 142 in the control circuit in FIG. 6B, the supply voltage of the sensor bridge circuits 120 can alternatively also be controlled using setting signal 142.

FIG. 7 shows an example of a stress-independent constant current source using the bandgap principle for generating a modulated AC current for generating a defined AC magnetic field which is independent of the mechanical stress. The well-known VPTAT power generation circuit internally generates a VPTAT voltage (voltage=proportional to absolute temperature) via a reference resistor that is largely (>99%) stress-independent. This can be achieved using a metal resistor or polysilicided resistor or a combination of resistors with different stress dependencies.

FIGS. 8A-8D schematically show different implementations of a first xMR sensor bridge circuit 120-1 and a second (replica) xMR sensor bridge circuit 120-2 with an associated current conductor 212 on a chip (WoC).

The aspects and features described in connection with a particular one of the preceding examples may also be combined with one or more of the further examples in order to replace an identical or similar feature of this further example or to additionally introduce the feature into the further example.

It is also understood that the disclosure of a plurality of steps, processes, operations or functions disclosed in the description or claims shall not be interpreted as being mandatorily in the order described, unless this is explicitly stated in the individual case or is absolutely necessary for technical reasons. Therefore, the preceding description does not limit the performance of a plurality of steps or functions to a specific order. Furthermore, in further examples, an individual step, an individual function, an individual process or an individual operation can include a plurality of sub-steps, subfunctions, subprocesses or suboperations and/or be subdivided into them.

If some aspects in the preceding sections have been described in association with an apparatus or a system, these aspects should also be understood as a description of the corresponding method. In this case, for example, a block, an apparatus or a functional aspect of the apparatus or of the system can correspond to a feature, for instance a method step, of the corresponding method. Accordingly, aspects described in connection with a method should also be understood as a description of a corresponding block, a corresponding element, a property or a functional feature of a corresponding apparatus or a corresponding system.

The following claims are hereby incorporated in the detailed description, where each claim can be a separate example by itself. It should also be noted that, although a dependent claim in the claims refers to a particular combination with one or more other claims, other examples may also include a combination of the dependent claim with the subject matter of any other dependent or independent claim. Such combinations are hereby expressly proposed, unless it is stated in the individual case that a particular combination is not intended. Furthermore, features of a claim should also be included for any other independent claim, even if this claim is not directly defined as being dependent on this other independent claim.

The invention claimed is:

1. A magnetic sensor apparatus, comprising:
a magnetic field generating circuit configured to generate a magnetic field;
a magnetic field sensor circuit configured to output a sensor signal in response to the magnetic field, wherein the sensor signal has a signal amplitude dependent on a sensitivity of the magnetic field sensor circuit;
an amplifier circuit configured to amplify the sensor signal and output an amplified sensor signal with an amplified signal amplitude; and
a control circuit configured to use a setting signal to set at least one of a supply signal of the magnetic field sensor circuit or a gain of the amplifier circuit such that the amplified signal amplitude corresponds to a target amplitude,
wherein the magnetic field generating circuit is configured to modulate an excitation current for generating the magnetic field according to a pseudo-random pilot signal, and
wherein the control circuit is configured to demodulate the amplified sensor signal according to the pseudo-random pilot signal.

2. The magnetic sensor apparatus as claimed in claim 1, wherein the magnetic field sensor circuit comprises a Hall sensor.

3. The magnetic sensor apparatus as claimed in claim 1, wherein the magnetic field sensor circuit comprises a magnetoresistive sensor.

4. The magnetic sensor apparatus as claimed in claim 1, wherein the magnetic field generating circuit has a current conductor for conducting an electrical excitation current, and wherein the current conductor and the magnetic field sensor circuit are arranged on a common chip.

5. A magnetic sensor apparatus, comprising:
a magnetic field generating circuit configured to generate a magnetic field;
a magnetic field sensor circuit configured to output a sensor signal in response to the magnetic field, wherein the sensor signal has a signal amplitude dependent on a sensitivity of the magnetic field sensor circuit;

an amplifier circuit configured to amplify the sensor signal and output an amplified sensor signal with an amplified signal amplitude; and a control circuit configured to use a setting signal to set at least one of a supply signal of the magnetic field sensor circuit or a gain of the amplifier circuit such that the amplified signal amplitude corresponds to a target amplitude, wherein the magnetic field generating circuit is configured to generate the magnetic field according to a pseudo-random pilot signal.

6. The magnetic sensor apparatus as claimed in claim 5, further comprising: a removal circuit configured to at least partially remove the pseudo-random pilot signal from the amplified sensor signal.

7. The magnetic sensor apparatus as claimed in claim 5, wherein the pseudo-random pilot signal is a digital n-bit signal, with n≥1.

8. The magnetic sensor apparatus as claimed in claim 6, wherein the removal circuit has an n-bit digital-to-analog converter (DAC) for the pseudo-random pilot signal, and the removal circuit is configured to subtract an output signal of the n-bit DAC from the amplified sensor signal, where n corresponds to a number of bits of the pseudo-random pilot signal.

9. A magnetic sensor apparatus, comprising:

a magnetic field generating circuit configured to generate a magnetic field;

a magnetic field sensor circuit configured to output a sensor signal in response to the magnetic field, wherein the sensor signal has a signal amplitude dependent on a sensitivity of the magnetic field sensor circuit;

an amplifier circuit configured to amplify the sensor signal and output an amplified sensor signal with an amplified signal amplitude;

a control circuit configured to use a setting signal to set at least one of a supply signal of the magnetic field sensor circuit or a gain of the amplifier circuit such that the amplified signal amplitude corresponds to a target amplitude; and a bandgap reference circuit configured to generate at least one of a constant reference voltage with the target amplitude or an electrical excitation current for the magnetic field generating circuit with a constant current intensity, wherein the bandgap reference circuit has a resistor independent of mechanical stress in order to generate the electrical excitation current independent of the mechanical stress.

10. The magnetic sensor apparatus as claimed in claim 1, wherein the control circuit has a differential amplifier configured to output the setting signal for at least one of the supply signal or the amplifier circuit based on a difference between the amplified signal amplitude and the target amplitude.

11. The magnetic sensor apparatus as claimed in claim 1, wherein the target amplitude is a constant amplitude or an amplitude ratiometrically dependent on a supply voltage of the magnetic sensor apparatus.

12. The magnetic sensor apparatus as claimed in claim 1, wherein the magnetic field generating circuit is configured to modulate an excitation current for generating the magnetic field according to a pseudo-random pilot signal, and wherein the control circuit is configured to demodulate the amplified sensor signal according to the pseudo-random pilot signal.

13. The magnetic sensor apparatus as claimed in claim 1, further comprising: a second magnetic field sensor circuit configured to output a second sensor signal which has a second signal amplitude dependent on a sensitivity of the second magnetic field sensor circuit; and a second amplifier circuit configured to amplify the second sensor signal and to output a second amplified sensor signal, wherein the control circuit is configured to use the setting signal to set at least one of a second supply signal of the second magnetic field sensor circuit or a second gain of the second amplifier circuit.

14. The magnetic sensor apparatus as claimed in claim 13, wherein the magnetic field sensor circuit and the second magnetic field sensor circuit are formed as a first replica circuit formed on a common chip, and wherein the amplifier circuit and the second amplifier circuit are formed as a second replica circuit formed on the common chip.

15. The magnetic sensor apparatus as claimed in claim 13, wherein the magnetic field sensor circuit and the second magnetic field sensor circuit are configured as a differential sensor, and wherein the magnetic field generating circuit is configured to generate the magnetic field for the magnetic field sensor circuit and the second magnetic field sensor circuit using a common mode signal.

16. The magnetic sensor apparatus as claimed in claim 2, wherein the magnetic field sensor circuit is a magnetic tunnel resistance (TMR) sensor bridge circuit.

17. A magnetic sensor apparatus, comprising:

a magnetic field generating circuit configured to generate a magnetic field;

a magnetic field sensor circuit configured to output a sensor signal in response to the magnetic field, wherein the sensor signal has a signal amplitude dependent on a sensitivity of the magnetic field sensor circuit;

an amplifier circuit configured to amplify the sensor signal and output an amplified sensor signal with an amplified signal amplitude; and a control circuit configured to use a setting signal to set at least one of a supply signal of the magnetic field sensor circuit or a gain of the amplifier circuit such that the amplified signal amplitude corresponds to a target amplitude, wherein the amplifier circuit is a digital amplifier circuit with an adjustable digital gain.

18. The magnetic sensor apparatus as claimed in claim 17, wherein the digital amplifier circuit has an analog-to-digital converter (ADC) with an adjustable reference voltage.

19. A method for compensating for sensitivity fluctuations of a magnetic field sensor circuit, comprising:

generating a magnetic field;

outputting, in response to the magnetic field, a sensor signal using the magnetic field sensor circuit, wherein the sensor signal has a signal amplitude dependent on a sensitivity of the magnetic field sensor circuit;

amplifying the sensor signal using an amplifier circuit in order to obtain an amplified sensor signal with an amplified signal amplitude; and setting at least one of a supply signal of the magnetic field sensor circuit or a gain of the amplifier circuit such that the amplified signal amplitude corresponds to a target amplitude, wherein generating the magnetic field includes generating the magnetic field according to a pseudo-random pilot signal.

20. The method as claimed in claim 19, further comprising: demodulating the amplified sensor signal according to the pseudo-random pilot signal.

21. The magnetic sensor apparatus as claimed in claim 1, wherein the control circuit is configured to receive the amplified sensor signal, generate the setting signal based on the amplified signal amplitude and the target amplitude, and provide the setting signal to a supply circuit of the magnetic field sensor circuit to set the supply signal of the magnetic field sensor circuit or provide the setting signal to the amplifier circuit to set the gain of the amplifier circuit such that the amplified signal amplitude corresponds to the target amplitude.

22. The magnetic sensor apparatus as claimed in claim 1, wherein the control circuit is configured to receive the amplified sensor signal, generate the setting signal based on the amplified signal amplitude and the target amplitude, and provide the setting signal to a supply circuit of the magnetic field sensor circuit to set the supply signal of the magnetic field sensor circuit such that the amplified signal amplitude corresponds to the target amplitude.

23. The magnetic sensor apparatus as claimed in claim 1, wherein the control circuit is configured to receive the amplified sensor signal, generate the setting signal based on the amplified signal amplitude and the target amplitude, and provide the setting signal to the amplifier circuit to set the gain of the amplifier circuit such that the amplified signal amplitude corresponds to the target amplitude, and wherein the amplifier circuit is an analog amplifier.

* * * * *